United States Patent
Tsai et al.

(10) Patent No.: US 9,000,876 B2
(45) Date of Patent: Apr. 7, 2015

(54) INDUCTOR FOR POST PASSIVATION INTERCONNECT

(75) Inventors: Hao-Yi Tsai, Hsin-Chu (TW); Hsien-Wei Chen, Hsin-Chu (TW); Hung-Yi Kuo, Taipei (TW); Jie Chen, New Taipei (TW); Ying-Ju Chen, Tuku Township (TW); Tsung-Yuan Yu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 66 days.

(21) Appl. No.: 13/419,272

(22) Filed: Mar. 13, 2012

(65) Prior Publication Data

US 2013/0241683 A1    Sep. 19, 2013

(51) Int. Cl.
*H01F 5/00* (2006.01)
*H01F 27/28* (2006.01)
*H01F 27/36* (2006.01)
*H01L 31/107* (2006.01)
*H01L 23/522* (2006.01)
*H01L 23/552* (2006.01)
*H01L 23/00* (2006.01)
*H01L 49/02* (2006.01)
*H01L 23/58* (2006.01)

(52) U.S. Cl.
CPC ........ *H01L 23/5225* (2013.01); *H01L 23/5227* (2013.01); *H01L 23/552* (2013.01); *H01L 23/585* (2013.01); *H01L 24/11* (2013.01); *H01L 28/10* (2013.01); *Y10T 29/4902* (2013.01)

(58) Field of Classification Search
USPC .............................. 336/200, 232, 84 R, 84 C
See application file for complete search history.

(56) References Cited

U.S. PATENT DOCUMENTS

| | | | |
|---|---|---|---|
| 6,586,844 B1 * | 7/2003 | Chang | 257/779 |
| 7,985,653 B2 * | 7/2011 | Lee et al. | 438/381 |
| 8,283,781 B2 * | 10/2012 | Wu et al. | 257/738 |
| 2006/0081968 A1 * | 4/2006 | Bai et al. | 257/678 |
| 2006/0290457 A1 * | 12/2006 | Lee et al. | 336/200 |
| 2007/0182521 A1 * | 8/2007 | Lin | 336/200 |
| 2007/0199734 A1 * | 8/2007 | Kudo et al. | 174/255 |
| 2008/0238599 A1 * | 10/2008 | Hebert et al. | 336/110 |
| 2011/0068481 A1 * | 3/2011 | Park et al. | 257/777 |
| 2012/0306070 A1 * | 12/2012 | Yew et al. | 257/737 |
| 2013/0265131 A1 * | 10/2013 | Yang et al. | 336/192 |

FOREIGN PATENT DOCUMENTS

| | | |
|---|---|---|
| JP | 2007-073611 | 3/2007 |
| JP | 2010-109075 | * 10/2008 |
| JP | 2010-109075 | 5/2010 |
| KR | 10-2008-0068983 | 7/2008 |

* cited by examiner

*Primary Examiner* — Elvin G Enad
*Assistant Examiner* — Kazi Hossain
(74) *Attorney, Agent, or Firm* — Slater & Matsil, L.L.P.

(57) ABSTRACT

An inductor device and method of forming the inductor device are provided. In some embodiments the inductor device includes a post passivation interconnect (PPI) layer disposed and an under bump metallization (UBM) layer, each disposed over a substrate. The PPI layer forms a coil and dummy pads. The dummy pads are disposed around a substantial portion of the coil to shield the coil from electromagnetic interference. A first portion of the UBM layer is electrically coupled to the coil and configured to interface with an electrical coupling member.

16 Claims, 8 Drawing Sheets

INDUCTOR FOR POST PASSIVATION INTERCONNECT

BACKGROUND

Advances in semiconductor device performance are largely attributable to reductions in device dimensions. Initially, the photolithographic and other micro-electronic fabrication techniques enabling such device scaling were not amenable to inductors, capacitors and other passive components often employed in semiconductor devices. Nevertheless, inductor design eventually evolved to take similar advantage of the advances in micro-electronic fabrication processes and experience scaling to a degree similar to that of active devices.

By way of example, inductors are now typically created on the surface of a semiconductor device substrate in a spiral shape created in a plane that is parallel to the substrate surface. The inductor may have several of these spiral-shaped coils as necessary to attain adequate inductance values. Unfortunately, conventional methods used to create the spiral-shaped inductors may produce inductor devices having limited performance.

The performance parameter of an inductor is typically indicated by its quality factor, Q. The quality factor is defined as the ratio between the energy stored in the reactive portion of the inductor and the energy that is lost in the reactive portion. In general, the higher the quality factor the better the performance of the inductor.

In some circumstances, an ultra-thick metal (UTM) process is utilized to fabricate inductors. However, the UTM process is rather complex and requires a large chip area. In addition, the UTM process may limit or constrain the pursuit of a high quality factor.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an inductor device. The invention may also be applied, however, to other semiconductor structures or circuits.

Figure 1:
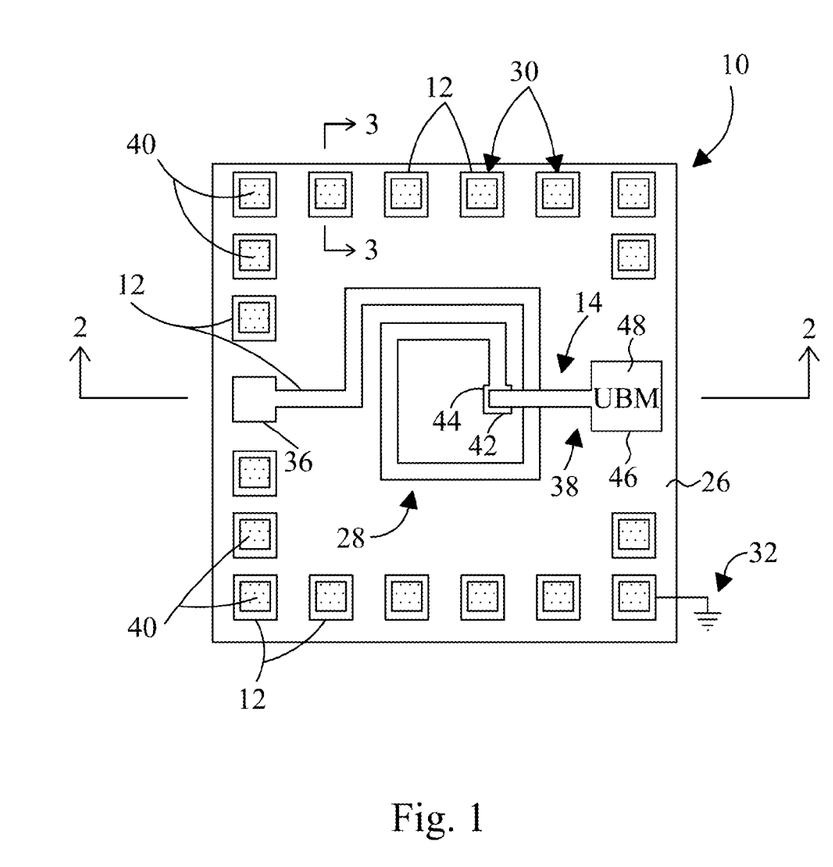
FIG. 1 is a partial plan view of one embodiment of an inductor device.
Figure 2:
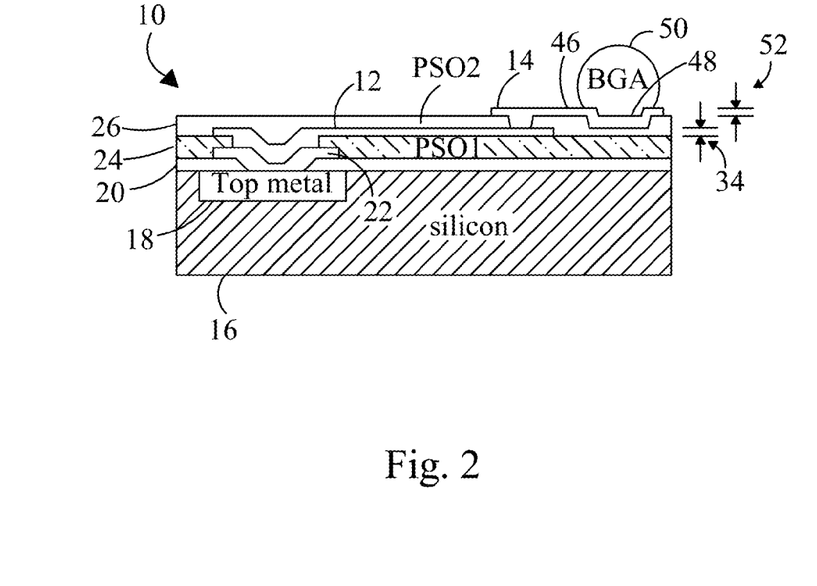
FIG. 2 is a cross section view, taken generally along line 2-2, of the inductor device of FIG. 1.

Referring concurrently to FIGS. 1-2, one embodiment of an inductor device 10 is illustrated. As will be more fully explained below, the inductor device 10 of FIGS. 1-2 provides good shielding from electromagnetic interference and a high quality factor, Q. The inductor device 10 generally includes a post passivation interconnect (PPI) layer 12 and an under bump metallization (UBM) layer 14 supported by, or engaged with, a substrate 16, a top metal layer 18, a passivation layer 20, a contact layer 22, a first polymeric material layer 24, and a second polymeric material layer 26. In some embodiments, an additional passivation layer may be formed between the first polymeric layer 24 and the passivation layer 20. Such a dual-passivation structure provides additional protection to the contact layer 22 by entirely or substantially embedding the contact layer 22 in passivation.

As shown in FIG. 2, the substrate 16 supports the top metal layer 18 from below. In some embodiments, the top metal layer 18 is formed directly on, or embedded within, the substrate 16. The top metal layer 18 may be electrically coupled to underlying metallization layers or other electronic devices, which for ease of illustration have not been shown in FIG. 2, disposed in the silicon of the substrate 16. The top metal layer 18 may be formed from copper or another highly conductive metal or material.

Still referring to FIG. 2, the passivation layer 20 is supported by the substrate 16 and a portion of the top metal layer 18. In some embodiments, the passivation layer 20 is formed from a passivating oxide, silicon nitride (SiN), silicon nitrogen oxide (SiNOx), or silicon oxide (SiOx). If the dual-passivation structure noted above is utilized, the additional passivation layer may be formed from the same materials or combinations thereof. As shown in FIG. 2, the passivation layer 20, either alone or with the top metal layer 18, supports the contact layer 22, which may form a contact passing through the open-window area in the passivation layer 20 to top metal layer 18. In some embodiments, the contact has a width of about 2 microns to about 5 microns. In some embodiments, the contact layer 22 is embedded in the passivation layer 20. As such, the contact layer 22 is disposed above, and in direct contact with, the top metal layer 18. In some embodiments, the contact layer 22 is formed from aluminum or another highly conductive material.

The first polymeric material layer 24 is formed over the passivation layer 20 and a portion of the contact layer 22. In some embodiments, the first polymeric material layer 24 is formed from polybenzoxaxole. As shown in FIG. 2, the first polymeric material layer 24 surrounds the contact layer 22. In addition, the first polymeric material layer 24 generally supports, along with the contact layer 22, the PPI layer 12 and a portion of the second polymeric material layer 26. As depicted in FIG. 2, first polymeric material layer 24, the contact layer 22, and the top metal layer 18 may be stacked such that these structures are generally vertically aligned with each other.

As collectively illustrated in FIGS. 1-2, the PPI layer 12 forms a coil 28 and dummy pads 30. In some embodiments, the PPI layer 12 forms the coil 28 and the dummy pads 30 simultaneously. As shown, the dummy pads 30 are generally arranged in a pattern so as to surround or encircle all or a substantial portion of the coil 28. In other words, the coil 28 is generally positioned within a boundary formed by the dummy pads 30. As such, the dummy pads 30 are able to shield the coil from electromagnetic interference. In some embodiments, the dummy pads 30 are electrically coupled to a ground 32 or to a low voltage source to further promote shielding from electromagnetic interference. In addition, one or more of the dummy pads 30 may be electrically coupled to each other using the PPI layer 12 or the UBM layer 14. In some embodiments, a thickness 34 or depth of the PPI layer 12 is greater than or equal to about 4 microns.

Referring now to FIG. 1, the coil 28 includes a coil contact pad 36 that is, in some embodiments, aligned with the pattern of the dummy pads 30. In other words, the coil contact pad 36 conforms to, or fits with, the general shape or outline of the dummy pads 30. In some embodiments, the contact pad 36 is not aligned to or with the dummy pads 30. In some embodiments, the pad size is not limited and can be electrically coupled to another UBM layer by contact 22, the UMB layer 14, or other metallization or electrical connection. In some embodiments, the dummy pads 30 and/or the coil 28 are generally square or rectangular when viewed from above as shown in FIG. 1. In such cases, a pattern formed by the coil 28 and the dummy pads 30 are generally concentric with each other. Those skilled in the art will recognize that the dummy pads 30 may form a pattern that resembles myriad other shapes when viewed from above.

In some embodiments, the dummy pads 30 are formed from a plurality of equally spaced-apart individual dummy pads each offset from a center of the coil 28 the same or a similar distance. In some embodiments, the dummy pads 30 are spaced apart from an outer boundary of the coil 28 by about 15 microns. Even so, those skilled in the art will recognize that the dummy pads 30 may have a variety of different configurations with a variety of different spacing.

Referring back to FIG. 2, the second polymeric material layer 26 is formed over a portion of the PPI layer 12 and under a portion of the UBM layer 14. As shown in FIGS. 1-2, in some embodiments the second polymeric material layer 26 is disposed directly on the dummy pads 30 and a portion of the coil 12. In addition, as shown in FIG. 2 a portion of the second polymeric material layer 26 is disposed directly beneath the UBM layer 14. In some embodiments, the second polymeric material layer 26 is formed from polybenzoxazole.

Referring concurrently to FIGS. 1-2, in some embodiments the UBM layer 14 generally includes a first portion 38 and a second portion 40. As shown, one end 42 of the first portion 38 is electrically coupled to corresponding end 44 of the coil 28. The other end 46 of the first portion 38 can include, or be electrically coupled to, an under bump mount 48 configured to support and interface with an electrical coupling member (e.g., a solder ball 50 from a ball grid array, a copper pillar, etc.). The solder ball 50 depicted in FIG. 2 is provided for the purpose of illustrating one form of an electrical coupling member or device and may be omitted in some embodiments. In some embodiments, a thickness 52 of the UBM layer 14 is greater than or equal to about 4 microns. In some embodiments, the UBM layer 14 is formed from copper, aluminum, or another highly conductive material.

In some embodiments, the under bump mount 48 and the coil contact pad 36 are located on opposing sides of the coil 28. In addition, the under bump mount 48 and the coil contact pad 36 may both be arranged to fit with, or conform to, the layout of the dummy pads 30. Even so, the under bump mount 48 and the contact pad 36 and may also be otherwise arranged.

The second portion 40 of the UBM layer 14 is disposed over and, in some embodiments, directly upon the dummy pads 30 to provide additional shielding from electromagnetic interference. In some embodiments, the second portion 40 of the UBM layer 14 and the dummy pads 30 are both electrically coupled and/or connected to the ground 32 or to a low voltage source in order to promote shielding from electromagnetic interference. In some embodiments, the top metal layer 18 may be electrically coupled to a high voltage and the UBM layer 14, the dummy pads 30, or both, may be electrically coupled to a low voltage.

Figure 3A:
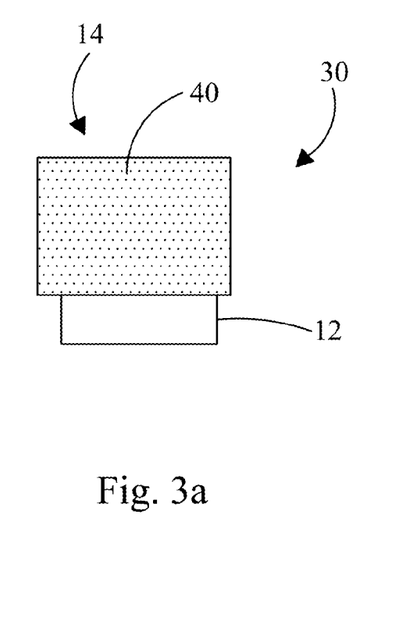
FIGS. 3a-3b are a cross section view, taken generally along line 3-3, of embodiments of the dummy pads in the inductor device of FIG. 1.
Figure 3B:
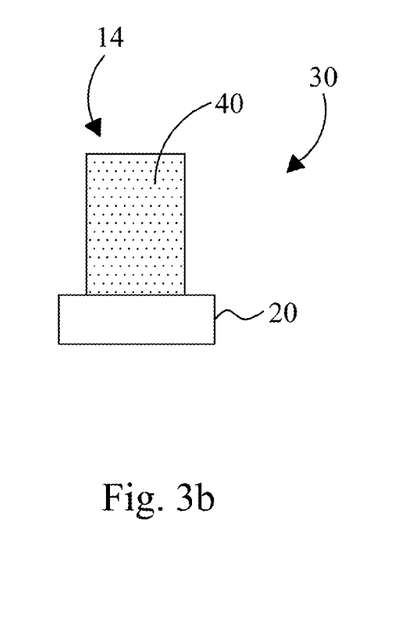

Referring now to FIG. 3a, which is a cross section of a single one of the dummy pads 30, in some embodiments the second portion 40 of the UBM layer 14 generally overlaps the underlying PPI layer 12. In other words, the footprint of second portion 40 of the UBM layer 14 is larger than that of the PPI layer 12. Referring now to FIG. 3b, in another embodiment the second portion 40 of the UBM layer 14 does not overlap the PPI layer 12. In other words, the footprint of second portion 40 of the UBM layer 14 is smaller than that of the PPI layer 12.

Figure 4:
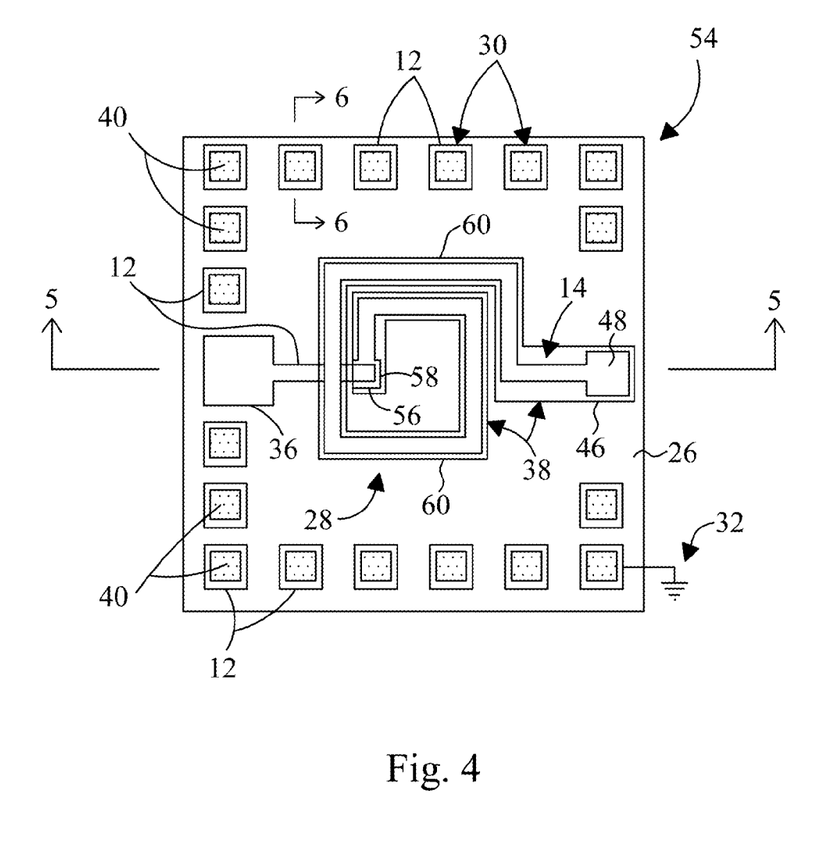
FIG. 4 is a partial plan view of another embodiment of an inductor device.
Figure 5:
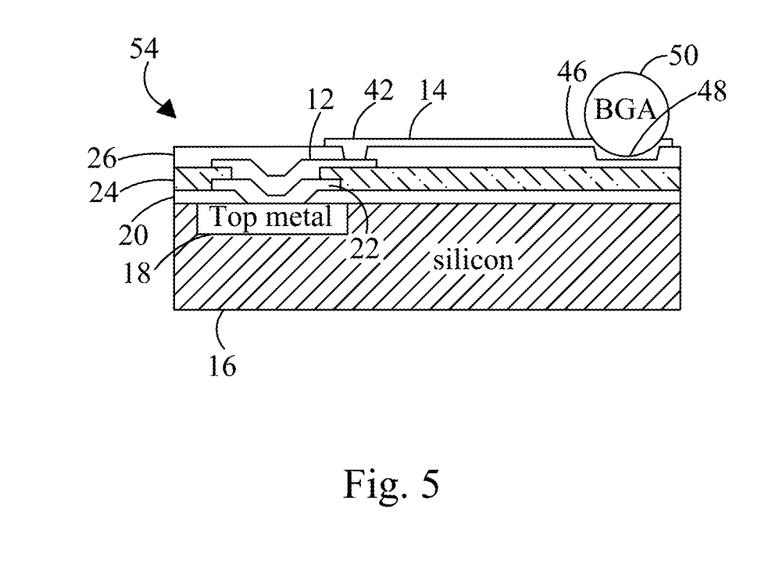
FIG. 5 is a cross section view, taken generally along line 5-5, of the inductor device of FIG. 4.

Referring now to FIGS. 4-5, another embodiment of an inductor device 54 is illustrated. Like the inductor device 10 of FIGS. 1-2, the inductor device 54 of FIGS. 4-5 also provides good shielding from electromagnetic interference and a high quality factor, Q. The inductor device 54 of FIGS. 4-5 also generally includes the PPI layer 12 and the UBM layer 14 supported by, or engaged with, the substrate 16, the top metal layer 18, the passivation layer 20, the contact layer 22, the first polymeric material layer 24, and the second polymeric material layer 26. However, in contrast to the inductor device 10 of FIGS. 1-2, the coil 28 in the inductor device 54 of FIGS. 4-5 is entirely or substantially formed by a first portion 38 of the UBM layer 14 instead of being formed from the PPI layer 12.

As shown in FIGS. 4-5, the PPI layer 12 forms only the coil contact pad 36 as depicted in FIGS. 1-2. An end 56 of the coil contact pad 36 is electrically coupled to a corresponding end 58 of the coil 28, which is composed of the UBM layer 14. The PPI layer 12 forms the dummy pads 30, which are disposed around all or a substantial portion of the coil 28. Therefore, the dummy pads 30 shield the coil 28 from electromagnetic interference.

The first portion 38 of the UBM layer 14 includes the under bump mount 48 configured to support and interface with the solder ball 50 from a ball grid array The solder ball 50 depicted in FIG. 5 is provided for the purpose of illustration one form of an electrical coupling member or device and may be omitted in some embodiments. As shown, in some embodiments the under bump mount 48 and the coil contact pad 36 are aligned with, or conform, to the layout of the dummy pads 30.

The second portion 40 of the UBM layer 14 is disposed over and, in some embodiments, directly upon the dummy pads 30 to provide additional shielding from electromagnetic interference. In some embodiments, the second portion 40 of the UBM layer 14 and the dummy pads 30 are both electrically coupled to the ground 32 or a low voltage source in order to promote shielding from electromagnetic interference. In addition, one or more of the dummy pads 30 may be electrically coupled to each other using the PPI layer 12 or the UBM layer 14.

As shown in FIGS. 4-5, in some embodiments a surface finish 60 is formed or otherwise deposited over or directly upon the first portion 38 of the UBM layer 14, the second portion 40 of the UBM layer 14, or both. The surface finish 60 generally protects the UBM layer 14 and may enhance or promote the reliability of the inductor device 54. In some embodiments, the surface finish 60 is composed of an electroless nickel electroless palladium (ENEP), electroless nickel electroless palladium immersion gold (ENEPIG), immersion tin (IT), immersion silver (IS), and the like.

Figure 6A:
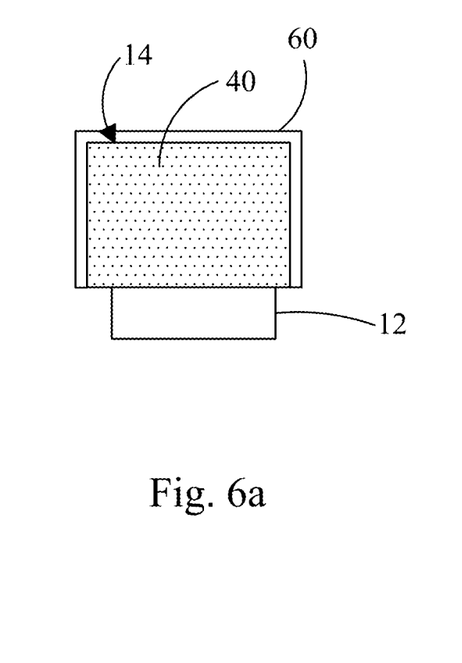
FIGS. 6a-6b are a cross section view, taken generally along line 6-6, of embodiments of the dummy pads in the inductor device of FIG. 4.
Figure 6B:
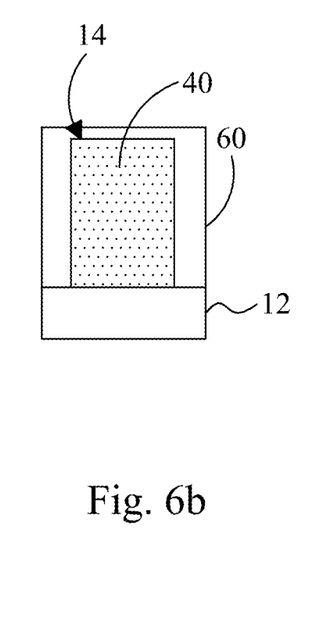

Referring now to FIG. 6a, which is a cross section of a single dummy pad 30, in some embodiments the second portion 40 of the UBM layer 14, the surface finish 60, or both generally overlap the underlying PPI layer 12. In other words, the footprint of the second portion 40 of the UBM layer 14, the surface finish 60, or the combination thereof is larger than that of the PPI layer 12. Referring now to FIG. 6b, in another embodiment the second portion 40 of the UBM layer 14, the surface finish 60, or both generally fail to overlap, or terminate at, the boundary of the PPI layer 12. In other words, the footprint of the second portion 40 of the UBM layer 14, the surface finish 60, or both is generally smaller than or equal to that of the individual dummy pad 30.

Figure 7:
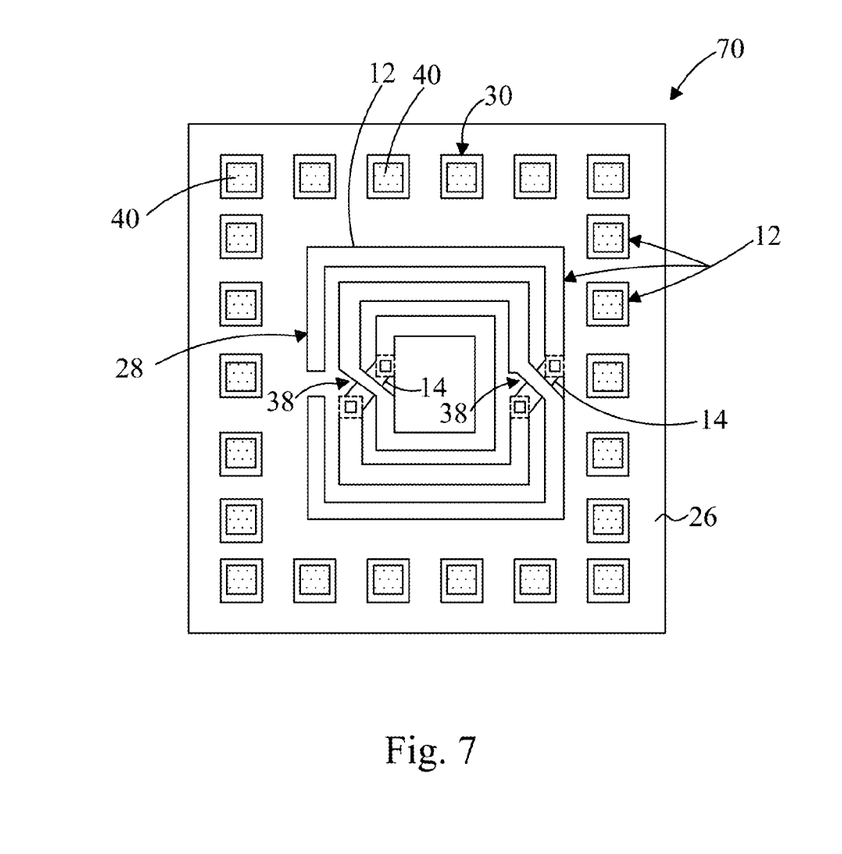
FIG. 7 is a partial plan view of another embodiment of an inductor device.

Referring now to FIG. 7, another embodiment of an inductor device 70 is illustrated. Like the inductor devices 10, 54 of FIGS. 1-2 and 4-5, respectively, the inductor device 70 of FIG. 7 also provides good shielding from electromagnetic interference and a high quality factor, Q. The inductor device 70 of FIG. 7 also generally includes the PPI layer 12 and the UBM layer 14. Although not shown in FIG. 7, the inductor 70 may also include structures present in the other inductor devices 10, 54 such as, for example, the substrate 16, the top metal layer 18, the passivation layer 20, the contact layer 22, and the first polymeric material layer 24. However, in contrast to the inductor devices 10, 54 of FIGS. 1-2 and 4-5, the coil 28 in the inductor device 70 of FIG. 7 is formed by separate paths of the PPI layer 12 coupled together by the first portion 38 of the UBM layer 14. In addition to the forms of the inductors 10, 54, 70 illustrated herein, those skilled in the art will recognize that other inductor patterns are also permissible without parting from the scope of the present disclosure.

Figure 8:
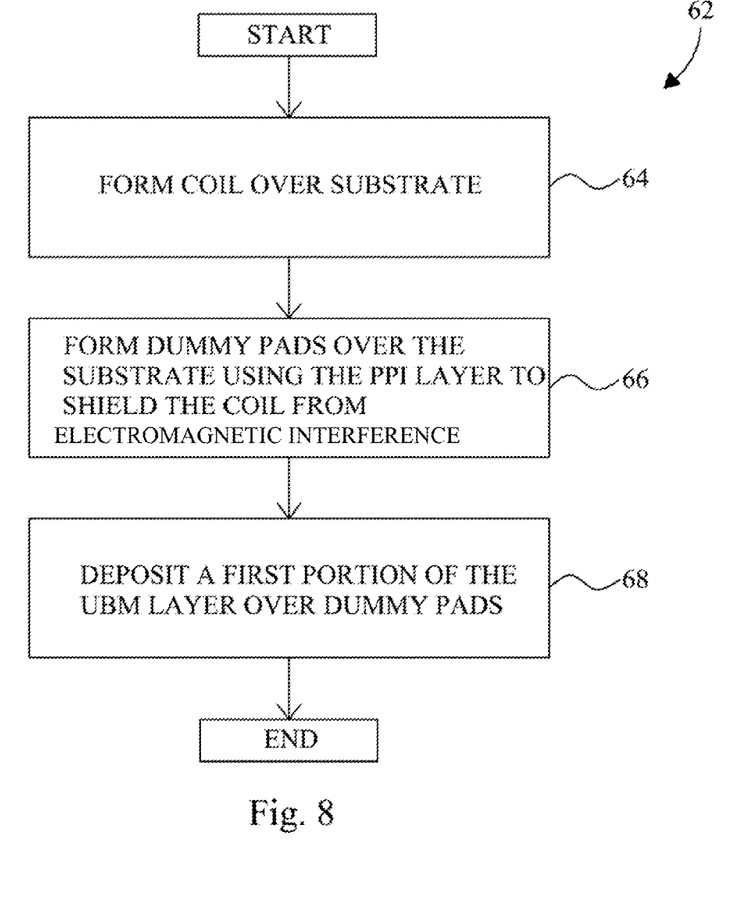
FIG. 8 is a flowchart illustrating a process of forming the inductor devices of FIGS. 1 and 4.

Referring now to FIG. 8, a method 62 of forming the inductor device 10, 54 is illustrated. In block 64, the coil is formed over the substrate 16. Thereafter, in block 66 the dummy pads 30 are formed over the substrate 16 using the PPI layer 12. Next, in block 68 the first portion 38 of the UBM layer 14 is deposited over the dummy pads 30. In some embodiments, not all portions of the PPI layer 12 are fabricated simultaneously (e.g., in one (photo) stage).

In some embodiments, the coil 28 and the dummy pads 30 are simultaneously formed simultaneously using the PPI layer 12. In some embodiments, the first portion 38 of the UBM layer 14 is used to form the coil 28 and the second portion 40 of the UBM layer 14 is deposited over the dummy pads 30 simultaneously. In addition, in some embodiments the surface finish 60 is deposited over the first portion 38 of the UBM layer 14, the second portion 40 of the UBM layer 14, or both. Moreover, in some embodiments the dummy pads 30, the first portion 38 of the UBM layer 14, or both are electrically coupled to the ground 32 or a low voltage source.

An inductor device comprising a post passivation interconnect (PPI) layer disposed over a substrate, the PPI layer forming a coil and dummy pads, the dummy pads disposed around a substantial portion of the coil to shield the coil from electromagnetic interference, an under bump metallization (UBM) layer disposed over the substrate, a first portion of the UBM layer electrically coupled to the coil and configured to interface with a ball grid array.

An inductor device comprising a post passivation interconnect (PPI) layer disposed over a substrate, the PPI layer forming a coil contact pad and dummy pads to shield the coil from electromagnetic interference, and an under bump metallization (UBM) layer disposed over the substrate, a first portion of the UBM layer forming a coil, the coil substantially disposed within the dummy pads, electrically coupled to the coil contact pad, and configured to interface with a ball grid array.

A method of forming an inductor device comprising forming a coil over a substrate, forming dummy pads over the substrate using a post passivation interconnect (PPI) layer, the dummy pads configured to shield the coil from electromagnetic interference, and depositing a portion of an under bump metallization (UBM) layer over the dummy pads.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An inductor device, comprising:
   a post passivation interconnect (PPI) layer disposed over a substrate, the PPI layer forming a coil and dummy pads, the dummy pads disposed around a substantial portion of the coil to shield the coil from electromagnetic interference; and
   an under bump metallization (UBM) layer disposed over the substrate, a first portion of the UBM layer electrically coupled to the coil and configured to interface with an electrical coupling member.

2. The inductor device of claim 1, wherein a second portion of the UBM layer is formed over the dummy pads to further shield the coil from electromagnetic interference.

3. The inductor device of claim 2, wherein the second portion of the UBM layer overlaps the dummy pads.

4. The inductor device of claim 2, wherein the second portion of the UBM layer does not overlap the dummy pads.

5. The inductor device of claim 2, wherein the second portion of the UBM layer is formed directly upon the dummy pads.

6. The inductor device of claim 1, wherein the coil includes a coil contact pad, the coil contact pad aligned with a pattern of the dummy pads.

7. The inductor device of claim 2, wherein the inductor device further include a top metal layer supported by the substrate, the top metal layer electrically coupled to a high voltage and at least one of the second portion of the UBM layer and the dummy pads electrically coupled to a low voltage.

8. The inductor device of claim 1, wherein the coil and a pattern formed by the dummy pads are generally concentric with each other when viewed from above.

9. The inductor device of claim 1, wherein the dummy pads are in at least one of a square, hexagonal, and circular pattern when viewed from above.

10. The inductor device of claim 2, wherein the first portion of the UBM layer includes a mount structure configured to support a conductive metal.

11. An inductor device, comprising:
    a post passivation interconnect (PPI) layer disposed over a substrate, the PPI layer forming a coil contact pad and dummy pads to shield a coil from electromagnetic interference; and
    an under bump metallization (UBM) layer disposed over the substrate, a first portion of the UBM layer forming the coil, the coil substantially disposed within the dummy pads, electrically coupled to the coil contact pad, and configured to interface with an electrical coupling member.

12. The inductor device of claim 11, wherein a second portion of the UBM layer is formed over the dummy pads to further shield the coil from electromagnetic interference.

13. The inductor device of claim 12, wherein the second portion of the UBM layer overlaps the dummy pads.

14. The inductor device of claim 12, wherein the second portion of the UBM layer does not overlap the dummy pads.

15. The inductor device of claim 12, wherein a surface finish is formed directly upon at least one of the first portion of the UBM layer and the second portion of the UBM layer.

16. The inductor device of claim 12, wherein the coil includes a coil contact pad and the first portion of the UBM layer includes an under bump mount, the coil contact pad and the under bump mount aligned with a pattern of the dummy pads, and wherein the inductor device further include a top metal layer supported by the substrate, the top metal layer electrically coupled to a high voltage and at least one of the second portion of the UBM layer and the dummy pads electrically coupled to a low voltage.

\* \* \* \* \*